United States Patent
Ono (10) Patent No.: US 7,459,401 B2
(45) Date of Patent: Dec. 2, 2008

(54) METHOD OF DIVIDING WAFER

(75) Inventor: Takashi Ono, Tokyo (JP)

(73) Assignee: Disco Corporation, Tokyo (JP)

( * ) Notice: Subject to any disclaimer, the term of this patent is extended or adjusted under 35 U.S.C. 154(b) by 373 days.

(21) Appl. No.: 11/338,652

(22) Filed: Jan. 25, 2006

(65) Prior Publication Data

US 2006/0166465 A1    Jul. 27, 2006

(30) Foreign Application Priority Data

Jan. 25, 2005    (JP) .............................. 2005-016845

(51) Int. Cl.
*H01L 21/302* (2006.01)
(52) U.S. Cl. .................. 438/704; 438/708; 438/709; 438/719; 438/725
(58) Field of Classification Search ................ 438/691, 438/708, 709, 719, 725, 704
See application file for complete search history.

(56) References Cited

U.S. PATENT DOCUMENTS

2003/0128802 A1*  7/2003  Matsuzawa .................. 378/34
2003/0190770 A1* 10/2003  Yeom et al. .................. 438/113
2006/0003551 A1*  1/2006  Mancini et al. ............. 438/462

FOREIGN PATENT DOCUMENTS

JP         2002-93752         3/2002

* cited by examiner

*Primary Examiner*—Binh X Tran
(74) *Attorney, Agent, or Firm*—Wenderoth, Lind & Ponack, L.L.P.

(57) ABSTRACT

A method of dividing and separating a wafer having a plurality of devices formed on its front surface, which are separated by streets. The method includes applying a resist film coating to a portion of the back surface of the wafer other than an area corresponding to the streets, and plasma etching the area of the back surface corresponding to the streets to divide the wafer into a plurality of individual devices. The thickness of the resist film coating is adjusted in the coating operation to allow the resist film to be completely removed during the plasma etching.

5 Claims, 7 Drawing Sheets

METHOD OF DIVIDING WAFER

BACKGROUND OF THE INVENTION

1. Field of the Invention

The present invention relates to a method of dividing a wafer.

2. Description of the Related Art

A wafer having a plurality of devices which are formed at a surface side and partitioned by streets is formed to be a certain thickness by grinding a back surface, and then subjected to cutting along the streets and, thereby divided into individual devices for use in various electronic instruments.

However, there has been a problem that since such cutting is performed by crushing the streets using a cutting blade rotated at high speed, the blade containing grinding particles such as diamond particles hardened by nickel plating and the like and being formed to be approximately 20 μm in thickness, therefore small chips appear on a cutting surface (side face) of the device, which reduces die strength of the device. In particular, when the thickness of the wafer is decreased to 100 μm or less, or further decreased to 50 μm or less, the problem is more significant.

Japanese Patent Application JP2004293693 discloses a technique wherein a resist film is coated on a back surface of a wafer, then the resist films in areas corresponding to the streets are removed, and then the areas corresponding to the streets are diced by using plasma etching, thereby the wafer is divided into individual devices. A technique of wafer dicing by etching is also disclosed, for example, in JP-A-2002-93752.

However, the wafer dicing by etching essentially needs a resist film for preventing etching of a device area, but the resist film firmly adheres to backs of the devices. Therefore, the resist film cannot be easily separated and, consequently, must be ashed, causing reduction in productivity.

SUMMARY OF THE INVENTION

Thus, the problem to be solved by the invention is to eliminate the need to separate the resist film in dicing by etching, so that productivity is improved.

The invention is a method of dividing a wafer into individual devices, the wafer having a plurality of devices which are formed on a surface and being pardoned by streets. The method includes at least a resist film coating step of coating a resist film on portions of the back of the wafer other than areas corresponding to the streets formed on the surface of the wafer, and a division step of performing plasma etching from a side of the back of the wafer coated with the resist film, so that the areas corresponding to the streets of the wafer are etched to divide the wafer into the individual devices; wherein the thickness of the resist film is adjusted in the resist film coating step such that the resist film is etched in the division step, thereby the resist film does not remain at the time when the wafer has been divided into the individual devices. Here, the width of the area corresponding to the street may be equal to the width of the street, or may be smaller than that. The time when the wafer has been divided into the individual devices includes the moment when the wafer has been divided, and a period after the wafer has been divided.

In the resist film coating step, preferably, it is assumed that an etching rate of the street is Y (μm/sec), an etching rate of the resist film is y (μm/sec), a thickness of the street is T (μm), a thickness of the resist film coated in the resist film coating step is t (μm), and a coefficient in accordance with the tolerance of t is K, and the thickness of the resist film t is calculated according to $t = K \cdot T \cdot y / Y$.

When a grinding step of grinding the back of the wafer is performed before the resist film coating step, it is preferable that etching is further performed after the resist film has been removed in the division step in order to remove stress in the backs of the individual devices produced in the grinding step. For example, the resist film contains any one of polyimide resin, epoxy resin, and acrylic resin.

In the invention, using a resist film that can be etched in spite of a low etching rate, a resist agent is removed to eliminate the of need of ashing at when dicing by etching has been completed. Therefore, a step of removing the resist film is unnecessary, improving productivity.

Moreover, when the thickness of the resist film t is calculated according to the calculation formula, $t = K \cdot T \cdot y / Y$, the thickness t for removing the resist film by etching can be accurately obtained, and a large tolerance for achieving a flexible response may be given to a value of t by adjusting a value of K.

Furthermore, when the grinding step of grinding the back of the wafer is performed before the resist film coating step, the etching is further performed after the resist film has been removed in the division step, thereby the stress in the backs of the individual devices produced in the grinding step can be removed, therefore die strength of the device can be improved.

BRIEF DESCRIPTION OF THE DRAWINGS

FIG. 5A to FIG. 5C are schematic sectional views showing a first example of a resist film coating step, wherein

FIG. 6A to FIG. 6D are schematic sectional views showing a second example of a resist film coating step, wherein

FIG. 7A to FIG. 7D are schematic sectional views showing a third example of the resist film coating step, wherein

DETAILED DESCRIPTION OF THE INVENTION

Figure 1:
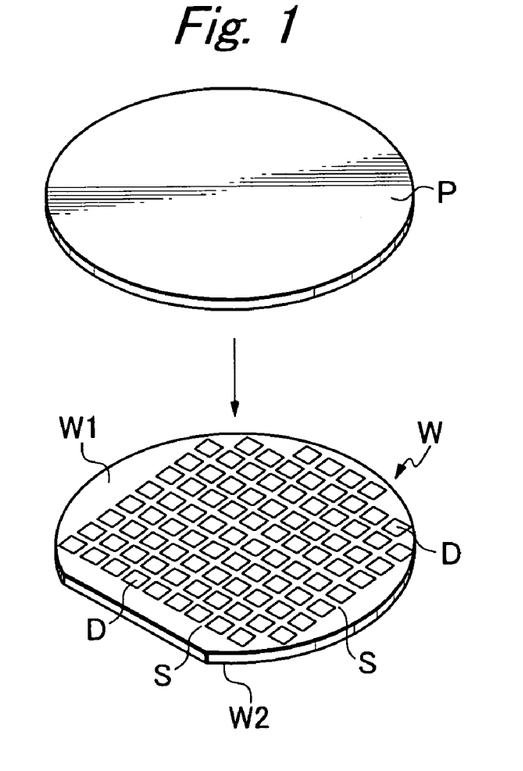
FIG. 1 is a perspective view showing an example of a wafer and a protection member.

A plurality of devices D are formed and partitioned by streets S on a surface W1 of a wafer W as shown in FIG. 1. First, as shown in FIG. 1, a protection member P for protecting the devices D is adhered to the surface W1 of the wafer W. As the protection member P, a hard plate such as a glass plate, a polyethylene terephthalate plate, or a ceramic plate is used. In addition, an adhesive tape can be used.

Figure 2:
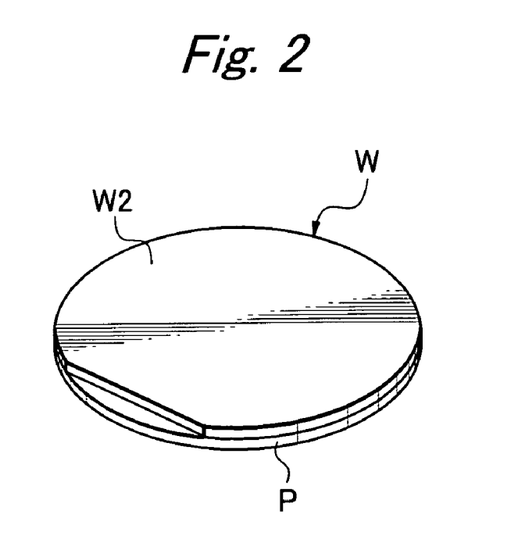
FIG. 2 is a perspective view showing a wafer having a surface on which the protection member is adhered.
Figure 3:
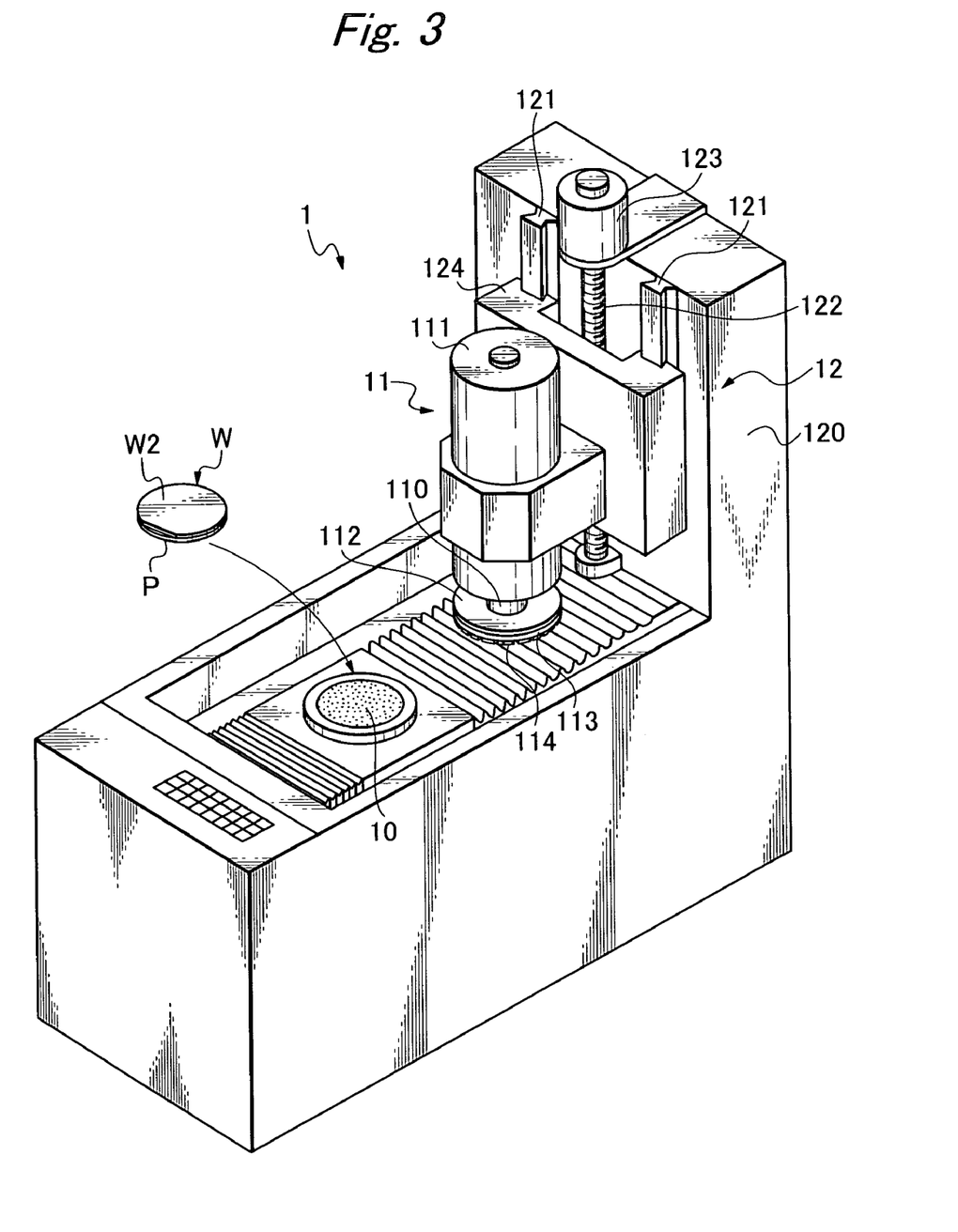
FIG. 3 is a perspective view showing an example of a grinding machine.

Next, as shown in FIG. 2, a back W2 of the wafer W having the surface W1 to which the protection member P has been adhered is directed upward, and then the back W2 is ground to have a certain thickness. In such grinding, for example, a grinding machine 1 as shown in FIG. 3 can be used. The grinding machine 1 has a chuck table 10 for holding the wafer, a grinding unit 11 for grinding the wafer held by the chuck table 10, and a grinding feed unit 12 for moving the grinding unit 11 toward and away from the chuck table 10.

The grinding unit 11 is configured from a spindle 110 having a vertical axis, a drive source 111 for rotationally driving the spindle 110, a grinding wheel 113 fixed at a lower end of the spindle 110 via a wheel mount 112, and a grinding stone 114 bonded to a lower surface of the grinding wheel 113. The grinding unit is configured in such a way that the grinding stone 114 is rotated with rotation of the spindle 110 driven by the drive source 111.

The grinding feed unit 12 is configured from a pair of guide rails 121 arranged vertically on a wall 120, a ball screw 122 arranged parallel to the guide rails 121, a pulse motor 123 connected to one end of the ball screw 122, and a support 124 that is slidably engaged with the guide rails 121 and has an internal nut screwed with the ball screw 122. The grinding feed unit is configured in such a way that the support 124 is moved up and down, guided by the guide rails 121, along with rotation of the ball screw 122 driven by the pulse motor 123, consequently the grinding unit 11 supported by the support 124 is also moved up and down.

On the chuck table 10, the protection member P is held, and the back W2 of the wafer W is exposed. The wafer W is positioned directly below the grinding unit 11 through horizontal movement of the chuck table 10. When the wafer W is positioned directly below the grinding unit 11, the wafer W is rotated with rotation of the chuck table 10, and the grinding unit 11 is moved down with the grinding stone 114 being rotated, so that the back W2 of the wafer W is contacted with the stone and ground to a certain thickness thereby. Grinding of the back W2 of the wafer W generates a damaged layer including grinding strain in the back W2, causing stress in the wafer W, which is a factor attributing to reduction in die strength.

Figure 4:
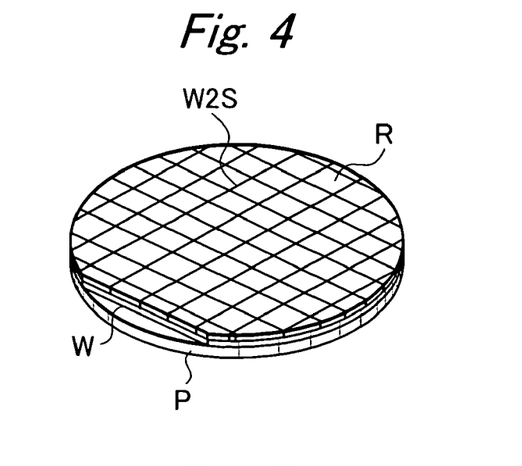
FIG. 4 is a perspective view showing a wafer after the resist film coating step has been completed.

When the wafer W is formed to have the certain thickness by grinding of the back W2, next, as shown in FIG. 4, a resist film R is coated on portions other than street-correspondent-areas W2S, which are areas corresponding to the streets S formed on the surface W1 of the wafer W (resist film coating step). As the resist film R, for example, a film containing any one of polyimide resin, epoxy resin, and acrylic resin can be used. There are various methods for realizing the resist film coating step. Several examples of them are described below.

Figure 5:
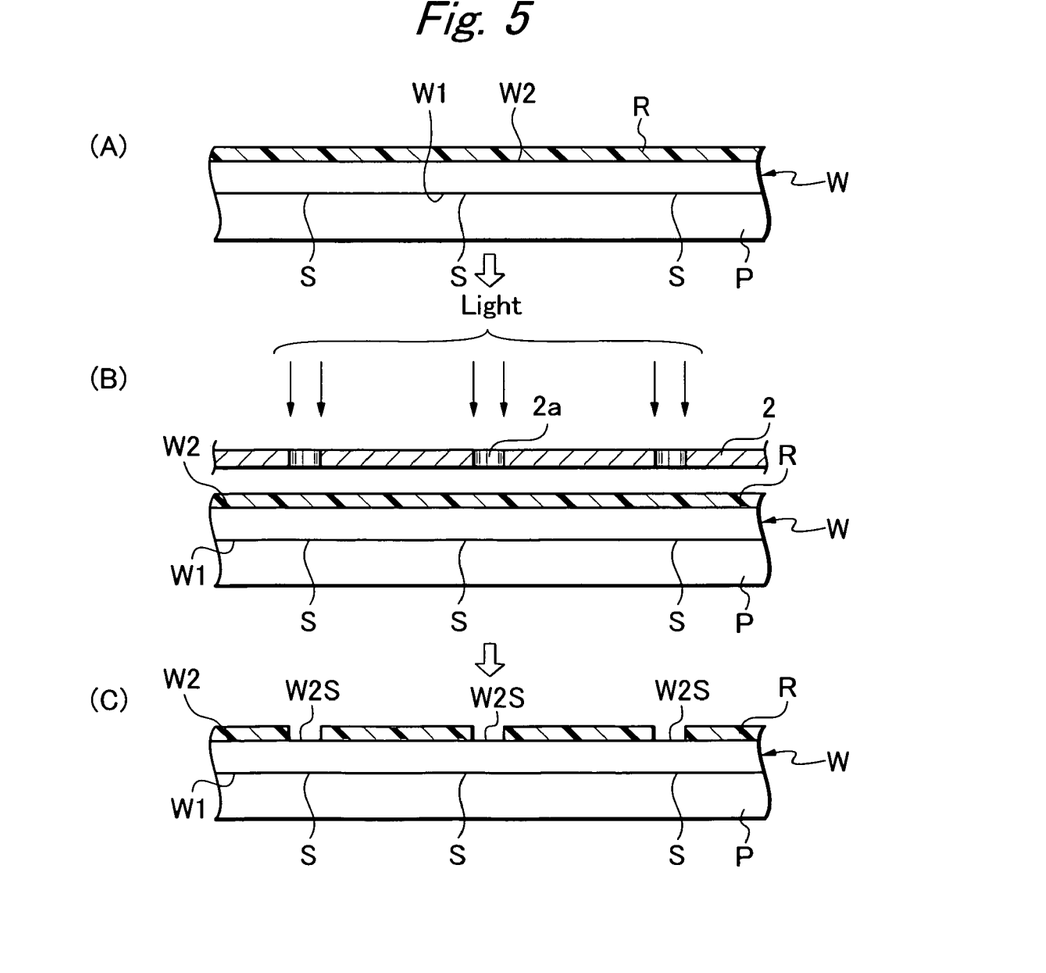
FIG. 5A shows a wafer having the resist film coated on the entire back surface.
FIG. 5B shows a method of exposing the resist film to expose street-correspondent-areas.
FIG. 5C shows a condition in which the street-correspondent-areas are exposed.

(1) First, as shown in FIG. 5A, the resist film R is coated on the entire surface of the back W2 using a spin coater and the like. Then, the streets S are recognized from the back W2 using an infrared camera and the like, and as shown in FIG. 5B. Light such as ultraviolet rays or X-rays are irradiated to the resist film R via a photomask 2 having a mask pattern 2a formed in the same pattern as that of the streets S, so that areas at on the back W2 corresponding to the streets S on the surface W1 are exposed. Then, when the exposed portions are developed, as shown in FIG. 5C, resist films at the back side corresponding to the streets S on the surface W1 are removed, and consequently the street-correspondent-areas W2S are exposed. According to such a method, since the resist films at the backside corresponding to the streets S can be efficiently removed, the method is efficient. Here, the mask pattern 2a is desirably formed such that the width of the pattern is smaller than width of the street S in order to prevent the resist films coated on backs of devices D from being exposed. Even if the photomask is not used, when the streets S at a side of the surface W1 are detected using the infrared camera and the like from a side of the back W2 of the wafer W, and light is irradiated to only the portions of the detected streets S, the resist films in the portions at the backside corresponding to the streets S are removed, and consequently the street-correspondent-areas W2S are exposed as in FIG. 5C.

Figure 6:
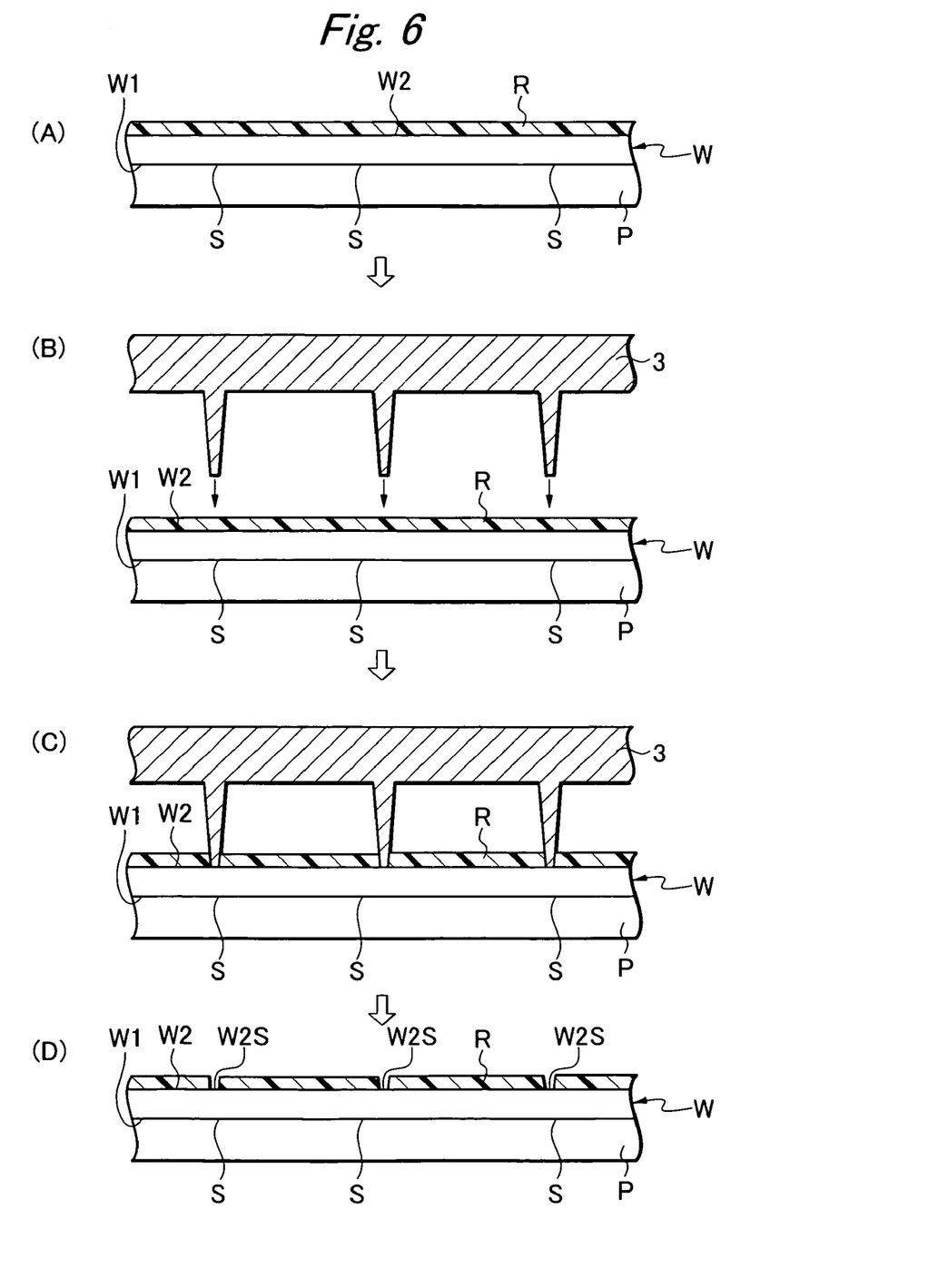
FIG. 6A shows a wafer having the resist film coated on the entire back surface.
FIG. 6B shows the wafer and a press member.
FIG. 6C shows a method of pressing the press member to the resist film to expose the street-correspondent-areas.
FIG. 6D shows a condition in which the street-correspondent-areas are exposed.

(2) As shown in FIG. 6A, the resist film is coated on the entire surface of the back W2 using the spin coater and the like. Then, the streets S are recognized from the back W2 using the infrared camera and the like, and a press member 3 formed in the same pattern as that of the streets S, as shown in FIG. 6B, is pressed to the resist film R, as shown in FIG. 6C. Thus, as shown in FIG. 6D, the resist films in the pressed portions, that is, the resist films in the portions at the backside corresponding to the streets S on the surface W1 are removed, and consequently the street-correspondent-areas W2S are exposed. According to such a method, since the resist films at the backsides of the streets S can be removed at a time, the method is efficient. The press member 3 is desirably formed such that width of a tip of the press member 3 is smaller than the width of the street S in order to prevent the resist film coated on the backs of the devices D from being removed.

Figure 7:
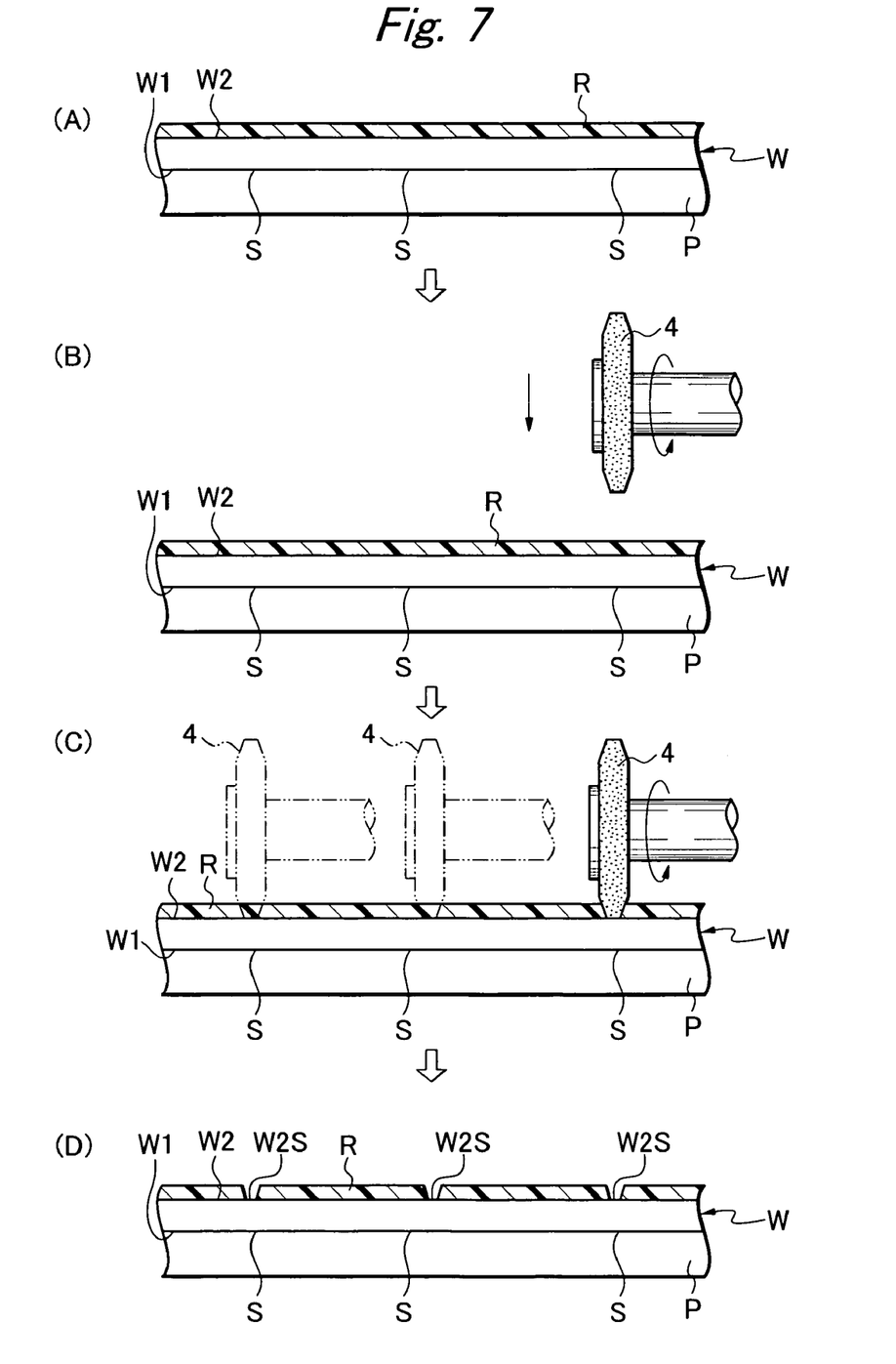
FIG. 7A shows a wafer having a resist film coated on the entire back surface.
FIG. 7B shows the wafer and a cutting blade.
FIG. 7C shows a method of exposing the street-correspondent-areas using the cutting blade.
FIG. 7D shows a condition in which the street-correspondent-areas are exposed.

(3) As shown in FIG. 7A, the resist film R is coated on the entire surface of the back W2 using the spin coater and the like. Then, the streets S are recognized from the back W2 using the infrared camera and the like; and then, as shown in FIG. 7B, a cuffing blade 4 having a thickness in correspondence with width of the street S is moved down and rotated at high speed; and then, as shown in FIG. 7C, the cutting blade 4 is moved into contact with each of the back sides corresponding to the streets S on the surface W1, and fed in a depth corresponding to thickness of the resist film R. When this operation is performed to the back sides corresponding to all the streets S, as shown in FIG. 7D, the resist films in the portions at the back side corresponding to the streets S on the surface W1 are removed, and consequently the street-correspondent-areas W2S are exposed. Here, the cutting blade 4 is desirably formed such that width of the blade is smaller than width of the street S in order to prevent the resist films coated on the backs of the devices D from being removed. Alternatively, instead of cutting using the cutting blade, irradiation of laser light may be used to modify the resist films R at the backsides of the streets S for removing the film. According to such a method, since a cutting machine or a laser processor typically used in dicing can be used, a special machine and the like are unnecessary, which is economical.

While not shown, the resist film can be coated on areas other than the back sides corresponding to the streets S even by injecting a resist material to form the resist film avoiding the portion of the back side corresponding to the streets S, such as by inkjet printing. In this case, the streets S on the surface W1 are detected by the infrared camera, and the resist material is injected to portions other than the detected streets. Such method is efficient because it does not require two separate operations; i.e. coating the resist film on the entire surface of the back W2 of the wafer W, and then removing the portions of the film at the backsides of the streets S.

Furthermore, it is acceptable that a mask material that repels the resist material has been applied on the portions at the backside corresponding to the streets S in the back W2 of the wafer W, and then the resist material is coated thereon, such as by a printing technique. According to such a method, since it is not necessary to recognize the backsides of the streets and the other areas in the stage of coating the resist film, operations are easy.

Figure 8:
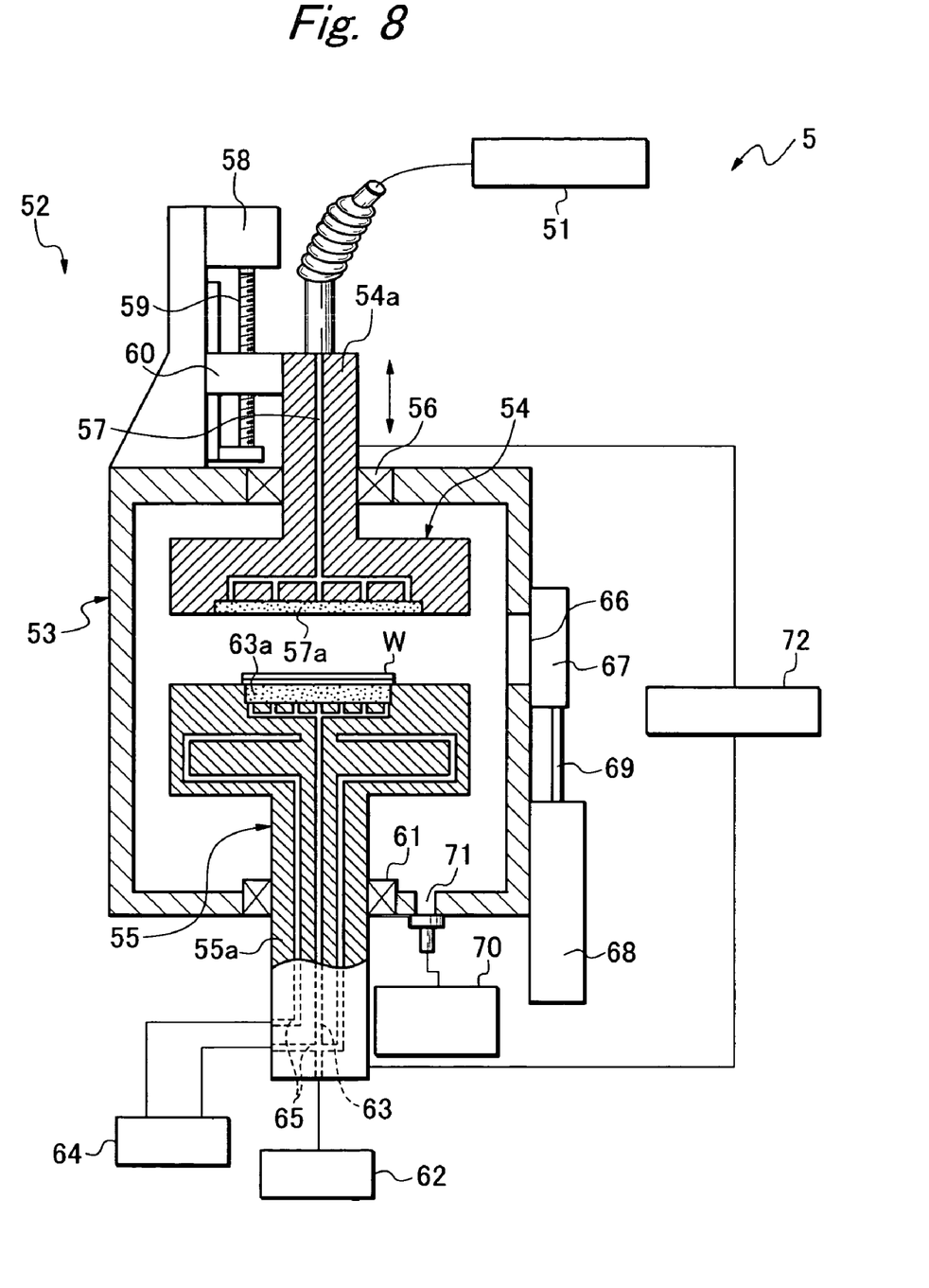
FIG. 8 is a cross sectional view showing an example of plasma etching apparatus.

By using the various methods described above, the resist film R is coated on the portions other than the street-correspondent-areas W2S on the back W2 of the wafer W, and only the street-correspondent-areas W2S are exposed, then the street-correspondent-areas W2S are etched for dividing the wafer into individual devices D (division step). For example, a plasma etching apparatus 5 as shown in FIG. 8 can be used in the division step.

The plasma etching apparatus 5 has a gas supply part 51 and an etching treatment part 52. The gas supply part 51 stores a fluorine-base stable gas that is a stable gas containing fluorine, such as $SF_6$, $CF_4$, $C_2F_6$, $C_2F_4$ and $CHF_3$. On the other hand, in the etching treatment part 52, a processing object W which has been grinded is received, and the fluorine-base stable gas supplied from the gas supply part 51 is made into a state of plasma for etching the wafer W.

The etching treatment part 52 is configured in such a way that an etching gas supply unit 54 is received by an upper side of a chamber 53 in which plasma etching is carried out, and a chuck table 55 for holding a disk-shaped object to be etched is received by a lower side.

The etching gas supply unit 54 has a function of supplying an etching gas to an exposed surface of the wafer W held by the chuck table 55, wherein a shaft 54a is inserted via a bearing 56 in an up-and-down movable manner with respect to the chamber 53, and a gas ventilation hole 57 that in communication with the gas supply part 51 and in communication with an injection part 57a formed by a porous member is formed within the unit. The etching gas supply unit 54 is configured in such a way that a ball screw 59 is rotationally driven by a motor 58, and the unit is moved up and down along with up-and-down movement of an up-and-down moving part 60 having a nut screwed with the ball screw 59.

On the other hand, the chuck table 55 is configured in such a way that a shaft 55a is rotatably inserted in the table via a bearing 61, and a suction channel 63 in communication with a suction source 62 and cooling channels 65 in communication with a cooling part 64 are formed within the table, and the suction channel 63 is in communication with a suction part 63a in an upper surface.

An opening 66, as a carrying in-and-out port of the disk-shaped object to be etched, is formed in a side of the chamber 53, and a shutter 67 for opening and closing the opening 66 by up-and-down movement is arranged outside the opening 66. The shutter 67 is moved up and down by a piston 69 that is driven and moved up and down by a cylinder 68.

An exhaust port 71 in communication with a gas exhaust part 70 is formed in a lower part of the chamber 53, so that used gas can be exhausted from the exhaust port 71. A high-frequency power source 72 is connected to the etching gas supply unit 54 and the chuck table 55, which supplies high frequency voltage and thus the etching gas can be made into the state of plasma.

Next, an etching operation in which the street-correspondent-areas W2S are etched using the plasma etching apparatus 5 as shown in FIG. 8 is described. As shown in FIG. 5A to FIG. 5C, the wafer W having the resist film R formed in the portions other than the street-correspondent-areas W2S in the back W2 enters the inside of the chamber 53 from the opening 66 which is opened with the shutter 67 being lowered, and the wafer is held by the suction part 63a while the back W2 on which the resist film R is coated is faced upwardly. Then, the shutter 67 is returned to an original position to close the opening 66, and then the inside is evacuated for pressure reduction.

Next, the etching gas supply unit 54 is moved down, and in that condition, the fluorine-base stable gas used as the etching gas is supplied from the gas supply part 51 into the gas ventilation hole 57 so that the etching gas is injected from the injection part 57a in a bottom of the etching gas supply unit 54. In addition, high frequency voltage is applied between the etching gas supply unit 54 and the chuck table 55 from the high frequency power source 72 so that the etching gas is made into the state of plasma and then supplied to the street-correspondent-areas W2S. Thus, by an etching effect of the plasma, portions of the back of the wafer W on which the resist film R is not coated, that is, the street-correspondent-areas W2S are etched. Then, when the areas are etched by a depth corresponding to thickness between the back W2 and the surface W1, all the streets S run through in a vertical direction and thus are separated longitudinally and latitudinally. Consequently, the wafer is divided into the individual devices D.

On the other hand, the resist film R may be etched during etching of the streets S, in spite of a low etching rate. Thus, if the resist film R is coated in the resist film coating step with the thickness of the film is adjusted such that when the wafer is divided into individual devices by etching the streets S, the resist film R is etched and removed, the need of removing the resist film R by ashing later is eliminated.

Figure 9:
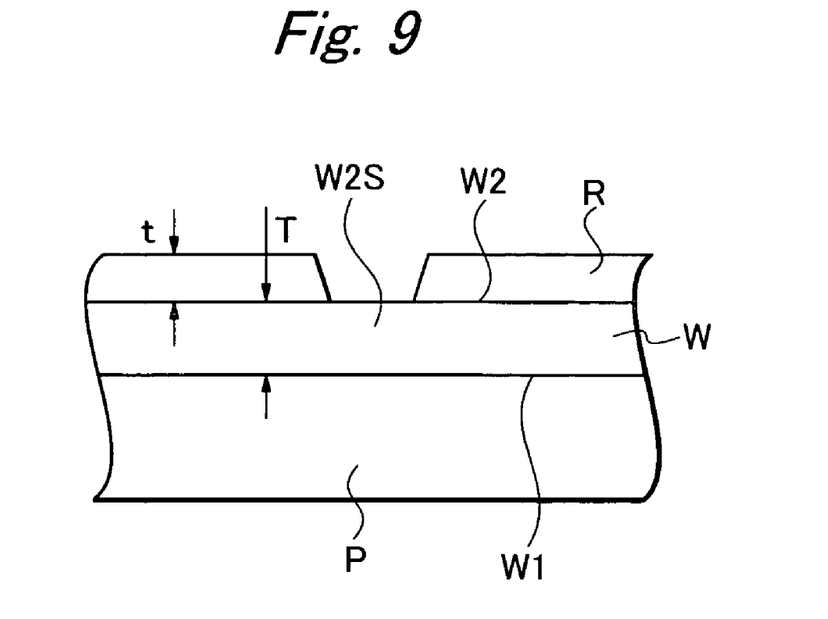
FIG. 9 is a front view showing the thickness of the wafer and the resist film in an enlarged manner.
Figure 10:
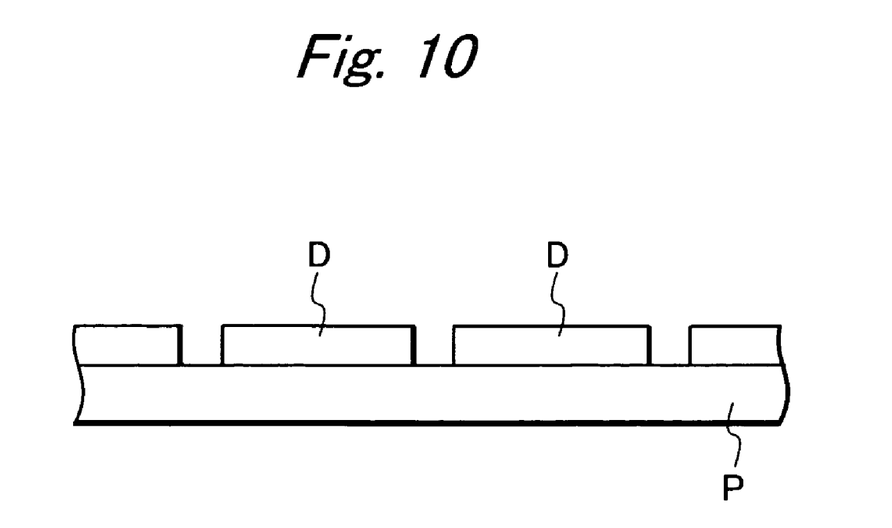
FIG. 10 is a front view showing a wafer after a division step has been completed in an enlarged manner.

As shown in FIG. 9, the thickness of the street S on the wafer W is T (μm), the thickness of the coated resist film R is t (μm), the etching rate of the streets S is Y (μm/t), and the etching rate of the resist film R is y (μm/t), and the time required for etching the street-correspondent-areas W2S to divide the wafer into the devices is (T/Y). On the other hand, the time required for removing the resist film R is (t/y). Therefore, if the resist film R is coated in a manner that the thickness "t" is adjusted such that a relation according to:

$$(T/Y)=(t/y) \qquad \text{equation (1)}$$

is established, when the wafer W is divided into the devices D, the resist film R is removed at the same time and. As shown in FIG. 10, the wafer is divided into individual devices and the resist films R are not present on the backs of the devices D. That is, when the equation (1) is transformed into:

$$t=T \cdot y/Y \qquad \text{equation (2)}$$

and "t" is previously obtained using the equation (2), in the resist film coating step and the resist film R is coated only by the thickness corresponding to the thickness 's', the resist film R can be removed at the same time that the wafer is divided into the devices D.

Actually, when the etching has been completed, since the resist film R may remain, or the streets S may not be separated from each together, a value of "t" is preferably given with a certain tolerance. Thus, it is desirable that a coefficient K in accordance with tolerance of t is determined, and t is obtained according to the following equation:

$$t=K \cdot T \cdot y/Y \qquad \text{equation (3)}$$

As a value of K in the equation (3), for example, about 0.95 to 1.05 is supposed.

For example, when the etching rate of the street-correspondent-areas W2S, Y is 0.417 (μm/sec); the etching rate of the resist film R, y is 0.03 (μm/sec); the thickness of the street-correspondent-areas W2S, T is 30 (μm); and coefficient K is 0.95, t=2.05 (μm) is obtained by substituting these values into the equation (3).

When a value of the coefficient K is set larger than 1, etching is sometimes continued even after the resist film R has been completely removed and the backs of the individual devices D may be etched. However, since stress such as grinding strain produced in the backs of the devices D during grinding can be removed by such etching, die strength of the devices D can be improved.

In this way, since all the streets can be separated by the plasma etching, cutting using the cutting blade is unnecessary. Therefore, chipping does not occur in the device, and the die strength of the device is not reduced, and consequently quality is not deteriorated. Moreover, since all the streets can be separated at one time by the plasma etching in the division step, the step is extremely efficient, and consequently productivity can be improved. Furthermore, anisotropy etching can be made in the plasma etching, and consequently side faces of the devices D can be formed approximately vertically.

After the resist film R has been removed in this way, the devices D are picked up from the protection member P, and then a step of adhering a die attach film to a back side, a step of bonding the devices to a lead frame and the like, and a step of mounting the devices on a wiring board are carried out.

What is claimed is:

1. A method of dividing a wafer into individual devices, the wafer having a plurality of devices formed on a front surface which are separated by streets, said method comprising:
    coating a resist film on a portion of a back surface of the wafer other than an area of the back surface corresponding to the streets separating the plurality of devices formed on the front surface of the wafer; and
    plasma etching from the back surface of the wafer at the area of the back surface corresponding to the streets to divide and separate the wafer into a plurality of individual devices,
    wherein said coating of the resist film comprises coating the resist film with a thickness such that the resist film is etched and completely removed by said plasma etching, whereby the resist film is not present on the plurality of individual devices.

2. The method of dividing the wafer according to claim 1, further comprising:
    grinding the back surface of the wafer before said coating of the resist film; and
    etching the wafer after the resist film has been completely removed by said plasma etching, so that a stress produced in a backside of each of the individual devices by said grinding of the back surface of the wafer is removed.

3. The method of dividing the wafer according to claim 1, wherein the resist film comprises any one of polyimide resin, epoxy resin, and acrylic resin.

4. The method of dividing the wafer according to claim 1, wherein the thickness of the resist film is: $t = K \cdot T \cdot y / Y$, wherein an etching rate of the streets is Y (μm/sec), an etching rate of the resist film is y (μm/sec), a thickness of the streets is T (μm), the thickness of the resist film is t (μm), and a coefficient in accordance with a tolerance of the thickness of the resist film t is K.

5. The method of dividing the wafer according to claim 4, further comprising:
    grinding the back surface of the wafer before said coating of the resist film; and
    etching the wafer after the resist film has been completely removed by said plasma etching, so that a stress produced in a backside of each of the individual devices by said grinding of the back surface of the wafer is removed.

* * * * *